(12) United States Patent
Tai et al.

(10) Patent No.: US 9,360,607 B1
(45) Date of Patent: Jun. 7, 2016

(54) COLOR FILTER ARRAY WITH SUPPORT STRUCTURES TO PROVIDE IMPROVED FILTER THICKNESS UNIFORMITY

(71) Applicant: OMNIVISION TECHNOLOGIES, INC., Santa Clara, CA (US)

(72) Inventors: Dyson H. Tai, San Jose, CA (US); Wei Zheng, Los Gatos, CA (US); Yin Qian, Milpitas, CA (US); Chen-Wei Lu, San Jose, CA (US); Jin Li, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 36 days.

(21) Appl. No.: 14/597,821

(22) Filed: Jan. 15, 2015

(51) Int. Cl.
| | |
|---|---|
| H04N 5/335 | (2011.01) |
| G02B 5/20 | (2006.01) |
| H04N 9/04 | (2006.01) |
| G02B 5/22 | (2006.01) |
| H04N 5/353 | (2011.01) |
| H04N 5/378 | (2011.01) |

(52) U.S. Cl.
CPC .............. *G02B 5/201* (2013.01); *H04N 9/045* (2013.01); *G02B 5/22* (2013.01); *H04N 5/3532* (2013.01); *H04N 5/378* (2013.01)

(58) Field of Classification Search
None
See application file for complete search history.

*Primary Examiner* — Roberto Velez
*Assistant Examiner* — Stephen Coleman
(74) *Attorney, Agent, or Firm* — Blakely Sokoloff Taylor & Zafman LLP

(57) ABSTRACT

A color filter array for use on a color image sensor includes an oxide grid having sidewalls arranged to define openings in the oxide grid. Each one of the openings is to be disposed over a corresponding pixel cell of the color image sensor. Oxide support structures are disposed in an interior region of each opening in the oxide grid over a corresponding pixel cell of the color image sensor. The openings in the oxide grid are filled with color filter material of a corresponding color filter. A surface tension between each oxide support structure and the surrounding color filter material of the color filter is adapted to provide uniform thickness for the color filters within the corresponding openings in the oxide grid.

18 Claims, 3 Drawing Sheets

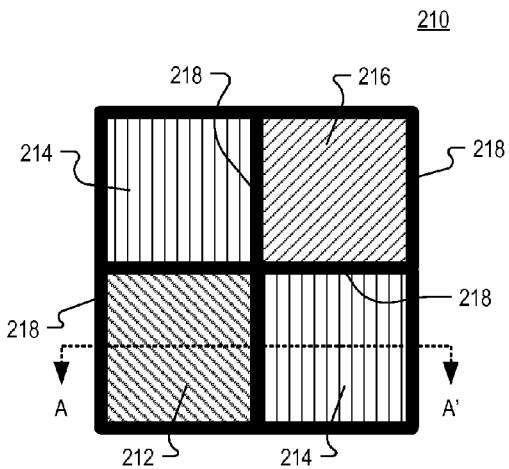
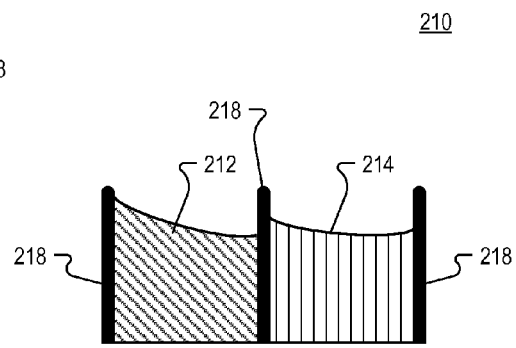
FIG. 2A  FIG. 2B
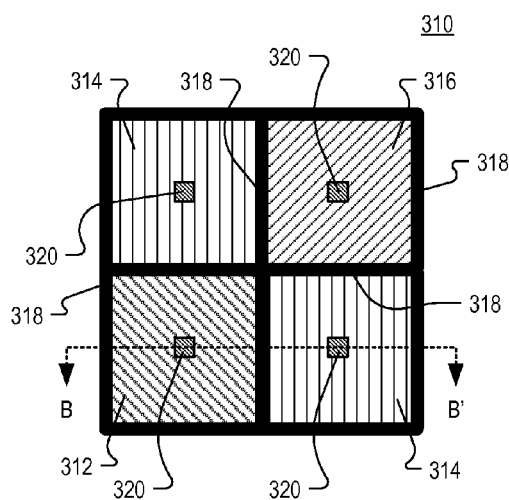
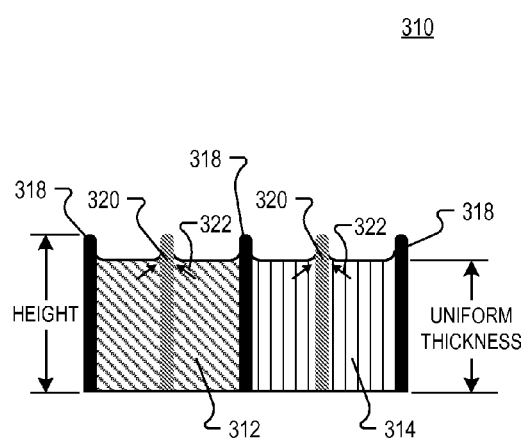
FIG. 3A  FIG. 3B

COLOR FILTER ARRAY WITH SUPPORT STRUCTURES TO PROVIDE IMPROVED FILTER THICKNESS UNIFORMITY

BACKGROUND INFORMATION

1. Field of the Disclosure

This invention is related to image sensors, and more particularly, to color filter arrays for use in color image sensors.

2. Background

Image sensors have become ubiquitous. They are widely used in digital still cameras, cellular phones, security cameras, as well as, medical, automobile, and other applications. The technology used to manufacture image sensors, and in particular, complementary metal-oxide-semiconductor (CMOS) image sensors (CIS), has continued to advance at a great pace. For example, the demands for higher resolution and lower power consumption have encouraged the further miniaturization and integration of these image sensors.

Conventional CMOS image sensors use color filter arrays to help capture color information. A color filter array includes a pattern of different colored filters to filter the light that reaches each pixel cell in an underlying color image sensor. In conventional color filter arrays, the thicknesses of the color filters vary differently within a wafer, which causes variations in color shading at different locations in the image sensor. These undesired color variations resulting from the non-uniform thicknesses in the color filter array degrade the quality of images that are captured by the color image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2A is an example plan view diagram that illustrates of a color filter array without support structures in accordance with the teachings of the present invention.

FIG. 2B is an example cross-section view of a color filter array without support structures in accordance with the teachings of the present invention.

FIG. 3A is an example plan view diagram that illustrates of a color filter array with support structures to provide improved filter thickness uniformity in accordance with the teachings of the present invention.

FIG. 3B is an example cross-section view of a color filter array with support structures to provide improved filter thickness uniformity in accordance with the teachings of the present invention.

Figure 1:
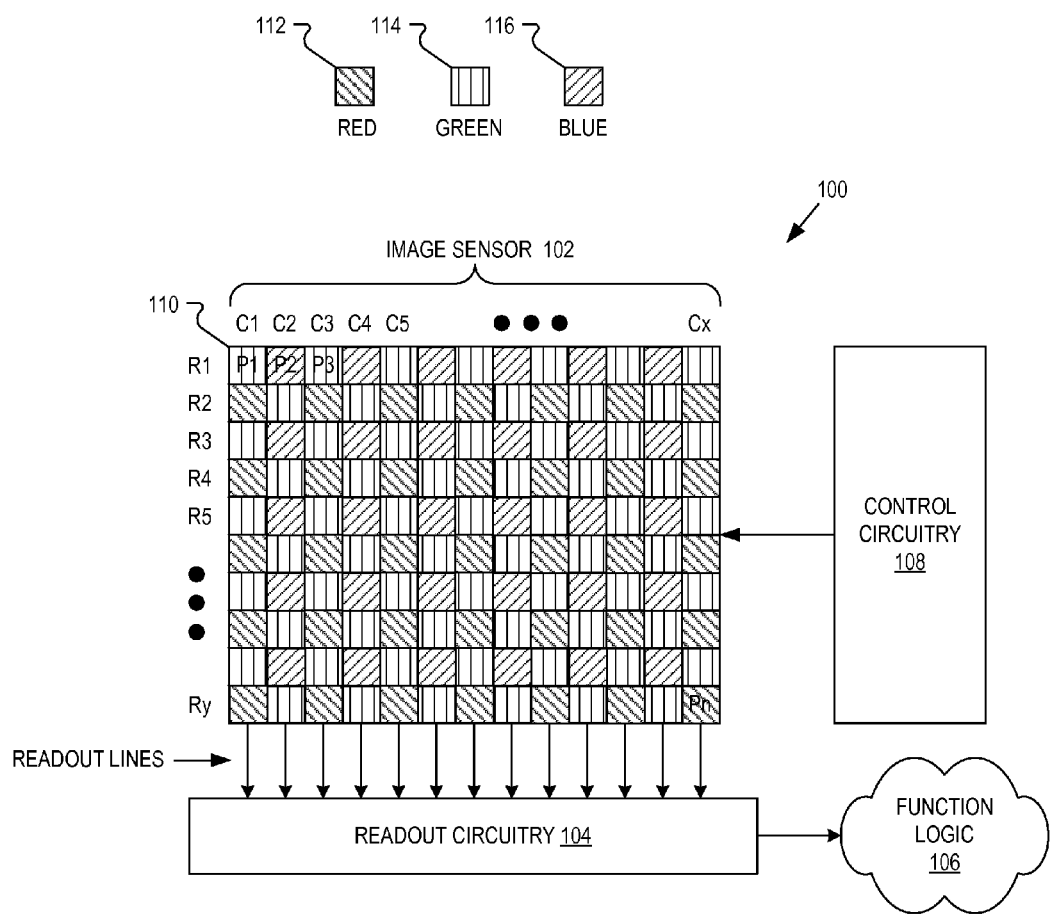
FIG. 1 is a diagram illustrating one example of an imaging system including a image sensor having a color filter array with support structures to provide improved filter thickness uniformity in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

A color filter array with support structures that provide improved filter thickness uniformity, and an imaging system including such a color filter array are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. For example, the term "or" is used in the inclusive sense (e.g., as in "and/or") unless the context clearly indicates otherwise.

As will be shown, examples of a color filter array with support structures that provide improved filter thickness uniformity are disclosed. Examples of a color filter include an oxide grid having oxide sidewalls that define the boundaries for each color filter in the color filter array. In the examples, an oxide support structure is included in an interior central portion within each opening defined by the oxide sidewalls. Each opening in the oxide grid that is defined by the oxide sidewall is filled with color filter material. Surface tension between the color filter material and the oxide support structure supports the interior region of the color filter material to provide improved uniform thickness for each color filter in the color filter array in accordance with the teachings of the present invention. The color filter array is to be disposed over an image sensor to provide a color image sensor in an imaging system with improved reduced color shading variations in accordance with the teachings of the present invention.

To illustrate, FIG. 1 is a diagram illustrating one example of an imaging system 100 that includes an image sensor 102 having a color filter array 110 with support structures to provide improved filter thickness uniformity in accordance with the teachings of the present invention. In particular, as shown in the depicted example, the imaging system 100 includes image sensor 102 with readout circuitry 104, function logic 106, and control circuitry 108 in accordance with the teachings of the present invention.

In one example, image sensor 102 is a color image sensor that includes a two dimensional (2D) array of pixel cells (e.g., pixel cells P1, P2, P3, . . . Pn). In various examples, image sensor 102 may be implemented as a front side illuminated sensor or as a back side illuminated sensor. In one example, a color filter array 110 is disposed over the array of pixel cells to assign color information to each of the underlying pixel cells. In one example, color filter array 110 may include red color filters 112, green color filters 114, and blue color filters 116 arranged in a pattern. For instance, as shown in the depicted example, the red color filters 112, green color filters 114, and blue color filters 116 are arranged in a Bayer pattern. It is appreciated of course that other combinations of colors, such as for example clear, cyan, magenta, etc., as well as other patterns may also be utilized in color filter array 110 in accordance with the teachings of the present invention. However, as will be discussed in greater detail below, the example color filters of color filter array 110 include support structures that provide improved filter thickness uniformity, and therefore reduced color shading variations in the color filter array 110 in accordance with the teachings of the present invention.

As illustrated in the depicted example, each pixel cell in image sensor 102 is arranged into a row (e.g., rows R1 to Ry) and a column (e.g., column C1 to Cx) to acquire image data for an image of a person, place, object, etc., which can then be used to render a 2D image of the person, place, object, etc., in accordance with the teachings of the present invention. For instance, in one example, incident light is directed from an object to the each pixel cell in image sensor 102, through the color filter array 110. Image charge is generated in each pixel cell in response to the incident light. After the image charge is generated in the pixel cells, image data is generated in response to the image charge, is read out by readout circuitry 104 through readout lines, and is then transferred to function logic 106.

In various examples, readout circuitry 104 may include circuitry such as for example amplification circuitry, analog-to-digital (ADC) conversion circuitry, or the like. Function logic 106 may include digital circuitry and may simply store the image data or even manipulate the image data with image signal processing techniques to apply post image effects (e.g., crop, rotate, remove red eye, adjust brightness, adjust contrast, or otherwise). In one example, readout circuitry 104 may read out a row of image data at a time along the readout lines (illustrated) or may read out the image data using a variety of other techniques (not illustrated), such as for example a serial read out or a full parallel read out of all pixels simultaneously.

In one example, control circuitry 108 is coupled to pixel cells in the image sensor 102 to control operational characteristics of image sensor 102. For example, control circuitry 108 may generate a shutter signal and other control signals coupled to pixel cells included in the image sensor 102 to control image acquisition. In one example, the shutter signal is a global shutter signal for simultaneously enabling all pixel cells included in the image sensor 102 to simultaneously capture their respective image data during a single acquisition window. In another example, the shutter signal is a rolling shutter signal such that each row, column, or group of pixels is sequentially enabled during consecutive acquisition windows.

FIG. 2A is an example plan view diagram that illustrates of a portion of a color filter array 210 without support structures in accordance with the teachings of the present invention. As shown, color filter array 210 includes a plurality of sidewalls 218 that define openings between the sidewalls 218. In the example, the opening defined by the plurality of sidewalls 218 in the upper left hand corner of FIG. 2A is filled with green color filter material 214. The opening defined by the plurality of sidewalls 218 in the upper right hand corner of FIG. 2A is filled with blue color filter material 216. The opening defined by the plurality of sidewalls 218 in the lower right hand corner of FIG. 2A is filled with green color filter material 214. The opening defined by the plurality of sidewalls 218 in the lower left hand corner of FIG. 2A is filled with red color filter material 212.

FIG. 2B is an example cross-section view of the color filter array 210 without support structures as illustrated in FIG. 2A along dashed line A-A'. As shown in the example cross-section view of FIG. 2B, the thicknesses of red color filter material 212 and of green color filter material 214 are non-uniform within the openings defined between the plurality of sidewalls 218. Furthermore, as shown in the example, the top surfaces of the red color filter material 212 and of green color filter material 214 are curved, or are non-planar, due to the surface tension along the plurality of sidewalls 218. Indeed, it is also noted that the variations in the thicknesses of the color filters in color filter array 210 vary differently through the entire wafer. As a consequence, the color thickness variations throughout the color filter array 210 cause different color shading variations at different locations throughout the color filter array 210, which results in degraded overall image quality of an image that is captured with an image sensor including color filter array 210.

FIG. 3A is an example plan view diagram that illustrates of a color filter array 310 with support structures 320 to provide improved filter thickness uniformity in accordance with the teachings of the present invention. As shown in the depicted example, color filter array 310 includes an oxide grid having a plurality of oxide sidewalls 318 that arranged to define a plurality of openings in the oxide grid. Each one of the plurality of openings defined by the plurality of sidewalls 318 is adapted to be disposed over a corresponding pixel cell of a color image sensor, such as for example image sensor 102 of FIG. 1. Accordingly, it is noted that color filter array 310 of FIG. 3 in one example of a portion of color filter array 110 of FIG. 1, and that similarly named and numbered elements referenced below are arranged and function similar to as described above.

As shown in the example depicted in FIG. 3A, color filter array 310 also includes a plurality of oxide support structures 320. As shown, each one of the plurality of oxide support structures 320 is disposed in an interior central region of the corresponding opening defined by the plurality of sidewalls 318 of the oxide grid. In one example, the height of each one of the plurality of oxide support structures 320 the same as, or substantially equal to, the height of each one of the plurality of oxide sidewalls 318.

Each one of the openings is also filed with corresponding color filter material to form the corresponding color filter. For instance, the example depicted in FIG. 3A shows that the opening defined by the plurality of sidewalls 318 in the upper left hand corner of FIG. 3A is filled with green color filter material 314. The opening defined by the plurality of sidewalls 318 in the upper right hand corner of FIG. 3A is filled with blue color filter material 316. The opening defined by the plurality of sidewalls 318 in the lower right hand corner of FIG. 3A is filled with green color filter material 314. The opening defined by the plurality of sidewalls 318 in the lower left hand corner of FIG. 3A is filled with red color filter material 312.

As shown in the depicted example, each one of the plurality of oxide support structures 320 is detached from the plurality of sidewalls 318 of the oxide grid such that each support structure is surrounded by color filter material. Accordingly, the oxide support structures 320 form oxide poles or pillars in the interior of each opening to provide support the color filter material in the middle of the color filter to provide a more uniform thickness for the color filter in accordance with the teachings of the present invention. In other examples, it is appreciated that each oxide structure 318 may be include a small pattern of oxide support structures within the interior portion of each opening.

To illustrate, FIG. 3B is an example cross-section view of the color filter array 310 with support structures 320 as illustrated in FIG. 3A along dashed line B-B' in accordance with the teachings of the present invention. As shown in the example cross-section view of FIG. 3B, there is surface tension 322 between each one of the plurality of oxide support structures 320 and the surrounding color filter material 312/314. In the example, the support provided with the surface tension 322 between each one of the plurality of oxide support structures 320 and the surrounding color filter material 312/314 is adapted to help provide uniform thickness for each one of the plurality of color filters in accordance with the teachings of the present invention. Furthermore, it is appreciated that the support provided by the surface tension 322 between each one of the plurality of oxide support structures 320 and the surrounding color filter material 312/314 also reduces the depth of the curved shape of each respective color filter as shown, which therefore results in a more planar top surface for each color filter in accordance with the teachings of the present invention.

Therefore, it is appreciated that color filter array 310 with support structures 320 provide improved filter thickness uniformity in accordance with the teachings of the present invention. As a result, the reduced color thickness variations throughout the color filter array 310 result in reduced color shading variations throughout the color filter array 310, which results in improved overall image quality of an image that is captured with an image sensor including color filter array 310 in accordance with the teachings of the present invention.

Figure 4:
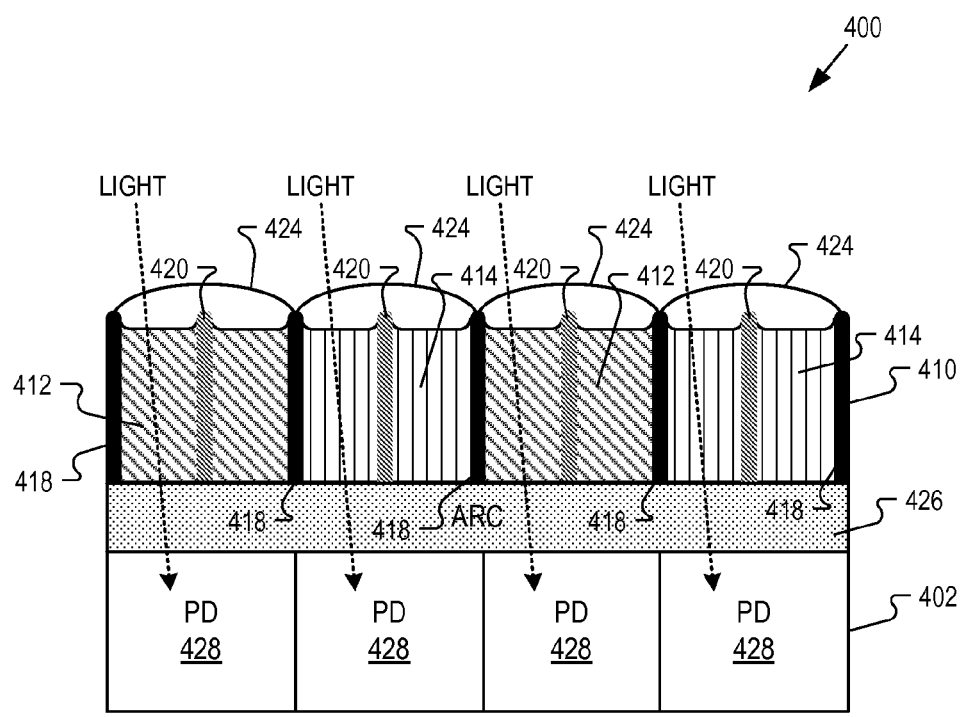
FIG. 4 is an example cross-section view illustrating one example of an imaging system including a image sensor having a color filter array with support structures to provide improved filter thickness uniformity in accordance with the teachings of the present invention.

FIG. 4 is an example cross-section view illustrating a portion of imaging system 400 including a image sensor having a color filter array with support structures to provide improved filter thickness uniformity in accordance with the teachings of the present invention. In particular, the example depicted in FIG. 4 shows a portion of an imaging system 400 including a color image sensor 402 having a plurality of pixel cells arranged in a pixel array. As shown in the example, each pixel cell of color image sensor 402 includes a photodiode (PD) 428. A color filter array 410 is disposed over color image sensor 402 such that light that is directed to the photodiodes 428 in the pixel cells of color image sensor 402 is directed through the color filter array 410 as shown. It is noted that color image sensor 402 of FIG. 4 is another example of color image sensor 102 of FIG. 1, and/or that color filter array 410 of FIG. 4 is another example of color filter array 110 of FIG. 1 or color filter array 310 of FIGS. 3A-3B. Accordingly, it is appreciated that similarly named and numbered elements referenced below are arranged and function similar to as described above.

Continuing with the example depicted in FIG. 4, imaging system 400 also includes a lens array including a plurality of lenses 424, which each lens 424 disposed over a corresponding color filter of color filter array 410 and underlying pixel cell of color image sensor 402 as shown. In one example, an antireflective coating (ARC) 426 is between color filter array 410 and color image sensor 402 as shown.

FIG. 4 also shows that color filter array 410 includes an oxide grid having a plurality of oxide sidewalls 418 that arranged to define a plurality of openings in the oxide grid. In one example, each one of the plurality of oxide sidewalls 418 is substantially aligned with the boundaries between the underlying pixel cells in color image sensor 402 as shown. Thus, each one of the plurality of openings defined by the plurality of sidewalls 418 is adapted to be disposed over a corresponding pixel cell of color image sensor 402. As shown in the depicted example, color filter array 410 also includes a plurality of oxide support structures 420. As shown, each one of the plurality of oxide support structures 420 is disposed in an interior region of the corresponding opening defined by the plurality of sidewalls 418 of the oxide grid.

Each one of the openings defined by the plurality of sidewalls 418 of the oxide grid is also filed with corresponding color filter material to form the corresponding color filter. For instance, the example depicted in FIG. 4 shows that the openings defined by the plurality of sidewalls 418 are filled with red color filter material 412 or green color filter material 414 to form part of a pattern of the color filter array 410. It is appreciated of course that other colors and combinations of colors may be used for the color filter material in the color filter array 410 in accordance with the teachings of the present invention As shown in the depicted example, each one of the plurality of oxide support structures 420 is detached from the plurality of sidewalls 418 of the oxide grid such that each support structure is surrounded by color filter material 412/414. Accordingly, the oxide support structures 420 form oxide poles or pillars in the interior of each opening to provide support the color filter material in the middle of the color filter to provide a more uniform thickness for the color filter in accordance with the teachings of the present invention as shown and as discussed in detail above.

Therefore, it is appreciated that color filter array 410 with support structures 420 provide improved filter thickness uniformity in accordance with the teachings of the present invention. As a result, the reduced color thickness variations throughout the color filter array 410 result in reduced color shading variations throughout the color filter array 410, which results in improved overall image quality of an image that is captured with color image sensor 402 in accordance with the teachings of the present invention.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A color filter array for use on a color image sensor, comprising:
   an oxide grid having a plurality of oxide sidewalls arranged to define a plurality of openings in the oxide grid, wherein each one of the plurality of openings is adapted to be disposed over a corresponding pixel cell of the color image sensor;
   a plurality of oxide support structures, wherein each one of the plurality of oxide support structures is adapted to be disposed in an interior region of a corresponding one of the plurality of openings in the oxide grid over the corresponding pixel cell of the color image sensor; and
   a plurality of color filters, wherein each one of the plurality of color filters is comprised of color filter material, wherein the each one of the plurality of openings in the oxide grid is filled with the color filter material of a corresponding one of the plurality of color filters, wherein a surface tension between each one of the plurality of oxide support structures and surrounding color filter material is adapted to provide uniform thickness for each one of the plurality of color filters within the corresponding one of the plurality of openings in the oxide grid.

2. The color filter array of claim 1 wherein each one of the plurality of oxide support structures is detached from the plurality of sidewalls of the oxide grid.

3. The color filter array of claim 1 wherein an antireflective coating is to be disposed between the oxide grid and the color image sensor.

4. The color filter array of claim 1 wherein a height of each one of the plurality of oxide support structures is equal to a height of each one of the plurality of oxide sidewalls.

5. The color filter array of claim 1 wherein light is to be directed through the color filter material of each one of the plurality of color filters to the corresponding pixel cell of the color image sensor.

6. The color filter array of claim 5 wherein each pixel cell of the color image sensor includes a photodiode, wherein the light is to be directed through the color filter material of to the photodiode of the corresponding pixel cell of the color image sensor.

7. The color filter array of claim 1 wherein the color filter material of each one of the plurality of color filters is one of red, green, or blue.

8. The color filter array of claim 7 wherein the plurality of color filters are arranged in a Bayer pattern in the color filter array.

9. An imaging system, comprising:
a color image sensor comprising a pixel array including a plurality of pixel cells;
control circuitry coupled to the pixel array to control operation of the pixel array;
readout circuitry coupled to the pixel array to readout image data from the plurality of pixels; and
a color filter array disposed over the color image sensor, wherein the color filter array includes:
an oxide grid having a plurality of oxide sidewalls arranged to define a plurality of openings in the oxide grid, wherein each one of the plurality of openings is disposed over a corresponding one of the plurality of pixel cells of the color image sensor;
a plurality of oxide support structures, wherein each one of the plurality of oxide support structures is disposed in an interior region of a corresponding one of the plurality of openings in the oxide grid over the corresponding one of the plurality of pixel cells of the color image sensor; and
a plurality of color filters, wherein each one of the plurality of color filters is comprised of color filter material, wherein the each one of the plurality of openings in the oxide grid is filled with the color filter material of a corresponding one of the plurality of color filters, wherein a surface tension between each one of the plurality of oxide support structures and surrounding color filter material is adapted to provide uniform thickness for each one of the plurality of color filters within the corresponding one of the plurality of openings in the oxide grid.

10. The imaging system of claim 9 further comprising function logic coupled to the readout circuitry to store the image data from each one of the plurality of pixel cells.

11. The imaging system of claim 9 wherein the color filter material of each one of the plurality of color filters is one of red, green, or blue.

12. The imaging system of claim 9 wherein the plurality of color filters are arranged in a Bayer pattern in the color filter array.

13. The imaging system of claim 9 wherein each one of the plurality of oxide support structures is detached from the plurality of sidewalls of the oxide grid.

14. The imaging system of claim 9 further comprising an antireflective coating disposed between the oxide grid and the color image sensor.

15. The imaging system of claim 9 wherein a height of each one of the plurality of oxide support structures is equal to a height of each one of the plurality of oxide sidewalls.

16. The imaging system of claim 9 further comprising a lens array disposed over the color filter array, wherein light is to be directed through the lens array and through the color filter material of each one of the plurality of color filters to the corresponding one of the plurality of pixel cells of the color image sensor.

17. The imaging system of claim 9 wherein light is to be directed through the color filter material of each one of the plurality of color filters to the corresponding one of the plurality of pixel cells of the color image sensor.

18. The imaging system of claim 17 wherein each one of the plurality of pixel cells of the color image sensor includes a photodiode, wherein the light is to be directed through the color filter material of to the photodiode of the corresponding pixel cell of the color image sensor.

* * * * *